(12) United States Patent
Forrest (10) Patent No.: US 8,450,730 B2
(45) Date of Patent: May 28, 2013

(54) LIGHT EMITTING DEVICE HAVING PERIPHERAL EMISSIVE REGION

(75) Inventor: Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 248 days.

(21) Appl. No.: 13/019,753

(22) Filed: Feb. 2, 2011

(65) Prior Publication Data

US 2011/0241046 A1    Oct. 6, 2011

Related U.S. Application Data

(60) Provisional application No. 61/341,411, filed on Mar. 31, 2010.

(51) Int. Cl.
*H01L 33/00* (2010.01)
*H01L 51/00* (2006.01)

(52) U.S. Cl.
USPC .................. 257/40; 257/98; 257/E51.018

(58) Field of Classification Search
USPC .................. 257/40, 98, E51.018
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A * | 7/2000 | Forrest et al. | 313/504 |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 2003/0230980 A1 | 12/2003 | Forrest et al. | |
| 2004/0174116 A1 | 9/2004 | Lu et al. | |
| 2006/0003266 A1 * | 1/2006 | Yi et al. | 430/320 |

OTHER PUBLICATIONS

U.S. Appl. No. 61/341,411, filed Mar. 31, 2010.

(Continued)

*Primary Examiner* — Victor A Mandala
(74) *Attorney, Agent, or Firm* — Morgan, Lewis & Bockius, LLP (57) ABSTRACT

Light emitting devices are provided that include one or more OLEDs disposed only on a peripheral region of the substrate. An OLED may be disposed only on a peripheral region of a substantially transparent substrate and configured to emit light into the substrate. Another surface of the substrate may be roughened or include other features to outcouple light from the substrate. The edges of the substrate may be beveled and/or reflective. The area of the OLED(s) may be relatively small compared to the substrate surface area through which light is emitted from the device. One or more OLEDs also or alternatively may be disposed on an edge of the substrate about perpendicular to the surface of the substrate through which light is emitted, such that they emit light into the substrate. A mode expanding region may be included between each such OLED and the substrate.

23 Claims, 4 Drawing Sheets

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

* cited by examiner

LIGHT EMITTING DEVICE HAVING PERIPHERAL EMISSIVE REGION

This application claims priority to U.S. Provisional Application No. 61/341,411, filed Mar. 31, 2010, the disclosure of which is incorporated by reference in its entirety.

This invention was made with government support under Contract No. SBIR DE-FG02-08ER85082, awarded by the Department of Energy. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices, and more specifically to organic light emitting devices that have one or more emissive peripheral regions or devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entireties.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

More details on OLEDs, and the definitions described above, can be found in U.S. Pat. No. 7,279,704, which is incorporated herein by reference in its entirety.

SUMMARY OF THE INVENTION

Light emitting devices are provided that include one or more OLEDs disposed only on a peripheral region of the substrate.

In an embodiment, an OLED may be disposed only on a peripheral region of a substantially transparent substrate and configured to emit light into the substrate. The OLED may be disposed on and/or parallel to a surface of the substrate. Another surface of the substrate may be roughened or include other features to outcouple light from the substrate. The edges of the substrate may be beveled and/or reflective. The area of the OLED(s) may be relatively small compared to the substrate surface area through which light is emitted from the device. One or more OLEDs also or alternatively may be disposed on an edge of the substrate about perpendicular to the surface of the substrate through which light is emitted, such that they emit light into the substrate. A mode expanding region may be included between each such OLED and the substrate.

In an embodiment, a device constructed to emit light at a brightness B may include a substrate with a first surface of area A and a second roughened surface, and an OLED with an operating brightness W that is greater than B disposed on the first side of the substrate. The OLED may have a surface area of not more than about (B/W)A, and the ratio B/W may be not more than about 0.2, or not more than about 0.1, for the device.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
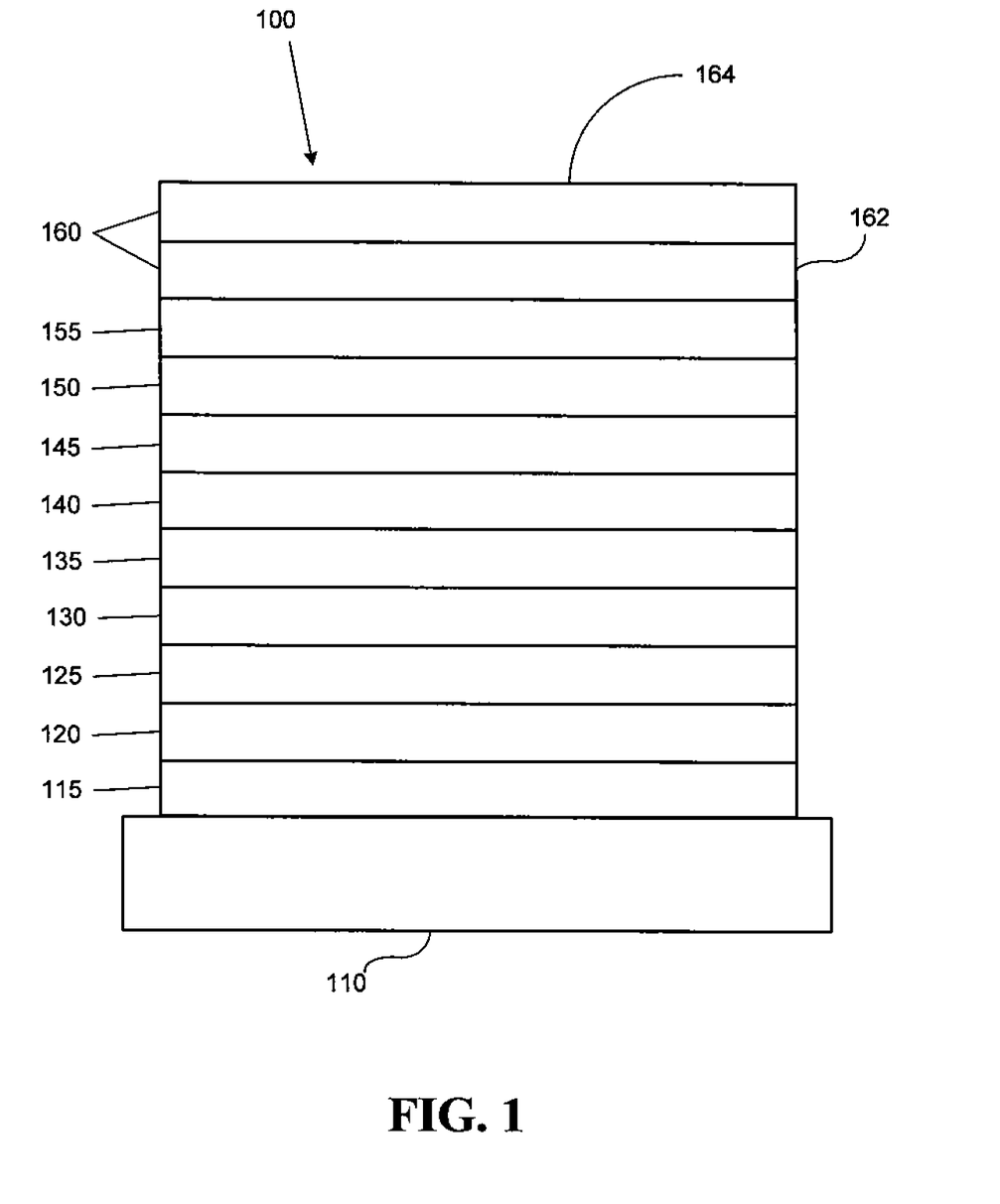
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F.sub.4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
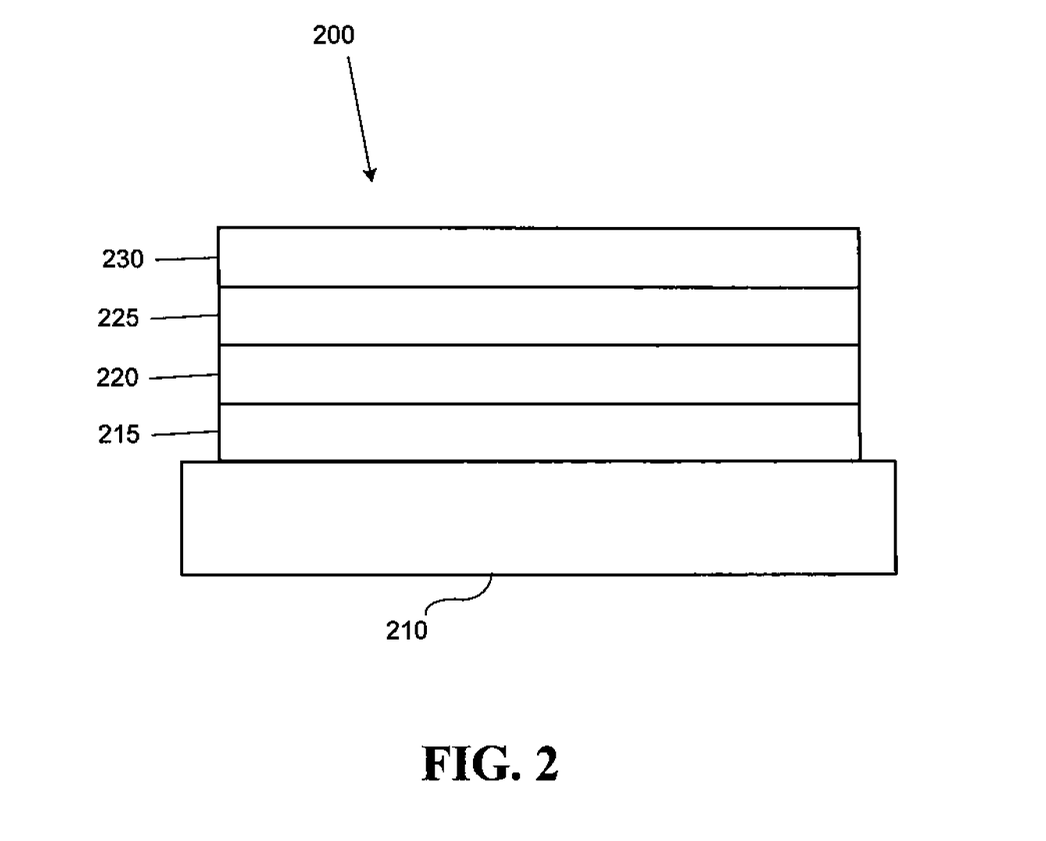
FIG. 2 shows an inverted organic light emitting device that does not have a separate electron transport layer.
Figure 3A:
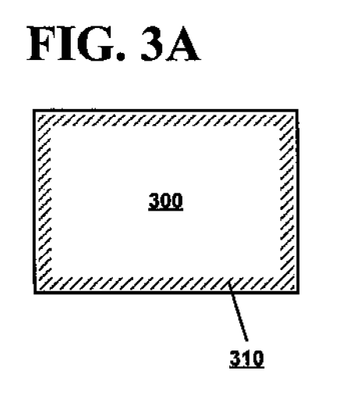
FIGS. 3A-3E show examples of substrates and peripheral regions.
Figure 3B:
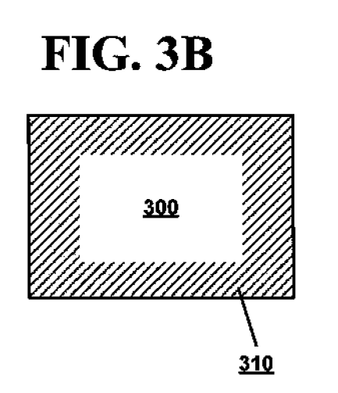
Figure 3C:
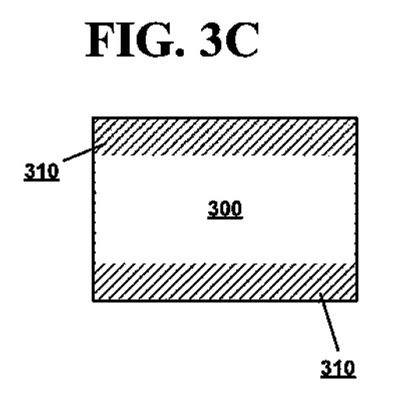
Figure 3D:
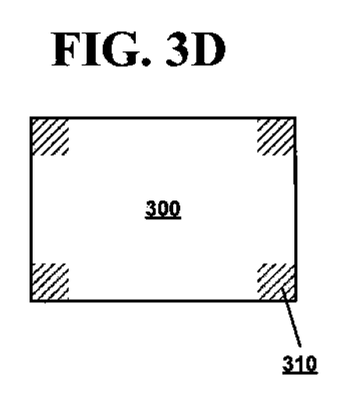
Figure 3E:
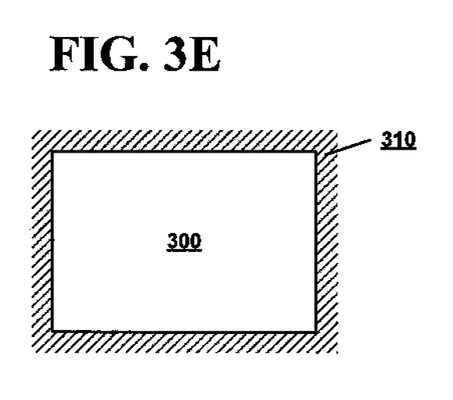

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In an embodiment, a device is provided that includes a transparent substrate and an organic light emitting device disposed only on a peripheral region of the substrate and configured to emit light into the substrate. As used herein, a "peripheral region" refers to an outermost region of the substrate surface on which the device is disposed, which excludes an inner portion of the substrate surface, including the centermost portion of the surface. FIGS. 3A-3E show examples substrates 300, with example peripheral regions 310 identified. The peripheral regions in FIGS. 3A-3E are provided as illustrative examples only, and different sizes and relative dimensions may be used without deviating from the meaning of a "peripheral region" as disclosed herein. In general, the peripheral region includes not more than about 70%, of the substrate surface by area. For various applications, the peripheral region may include only different portions of the substrate surface area, such as 5%, 10%, 20%, 30%, or any desired portion. For example, where the light emitting device is used to provide a lighting fixture having a bright or dark outline as described herein, the dimensions of the peripheral region may be selected to provide an outline having the desired thickness or other dimensions. In other configurations, the dimensions of the peripheral region may be selected to provide a desired level of illumination, while maintaining the other features described herein. The peripheral region also may include a region of space extending beyond the outer edge of the substrate, such as where one or more light emitting devices is disposed perpendicular to a largest surface of the substrate as described herein.

In some configurations, the light emitting device may be disposed on or about parallel to a largest surface of the substrate, such as the top or bottom of the substrate. Typical substrates may be considered as a flat sheet, with a top and bottom surface that are significantly larger in surface area than the sides of the substrate, and above which organic layers, electrodes, and other layers of an emissive device typically are constructed. In other configurations, one or more light emitting devices may be disposed about perpendicular to the top and bottom of the substrate, or at an angle relative to the top and bottom of the substrate.

Figure 4A:
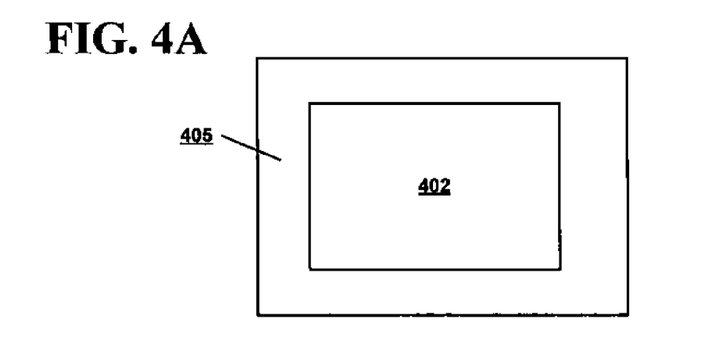
FIG. 4A shows a top schematic view of a device having OLEDS disposed in a peripheral region of a substrate.
Figure 4B:
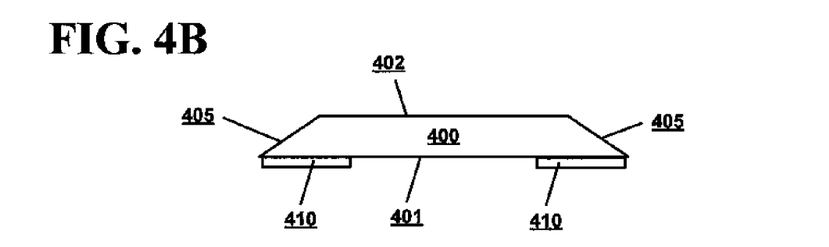
FIG. 4B shows a side schematic view of a device having OLEDS disposed in a peripheral region of a substrate.

FIGS. 4A and 4B show top and side schematic views, respectively, of a device having OLEDS disposed in a peripheral region of a substrate. The substrate 400 has a top surface 402 and a bottom surface 401. OLEDx 410 are disposed in the peripheral region of the substrate 400, and not in the central portion of the substrate, i.e., the region of the substrate between the two illustrated OLEDs 410. The sides 405 of the substrate may be beveled, i.e., disposed at an angle other than ninety degrees with respect to the top and bottom surfaces, as shown, or they may be perpendicular or about perpendicular to the top and bottom surfaces 401, 402 of the substrate.

Figure 5A:
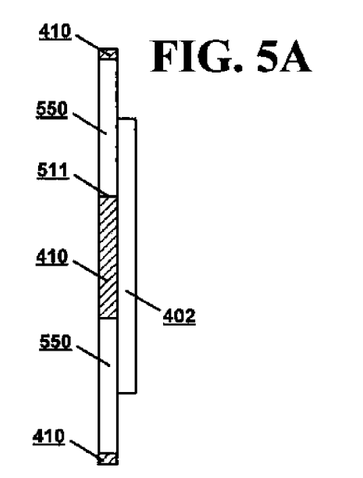
FIG. 5A shows a side schematic view of a device having OLEDs disposed in a peripheral region that extends beyond the outer edge of the substrate.
Figure 5B:
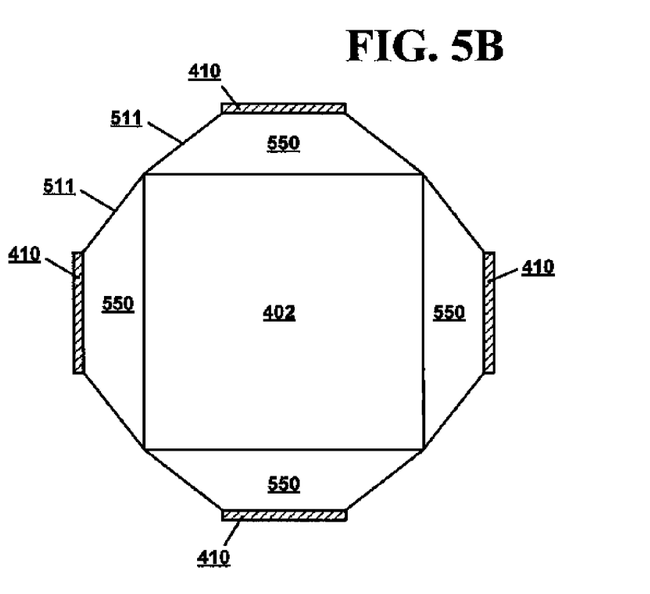
FIG. 5B shows a top schematic view of a device having OLEDs disposed in a peripheral region that extends beyond the outer edge of the substrate.

FIGS. 5A and 5B show side and top schematic views, respectively, of a device having OLEDs disposed in a peripheral region that extends beyond the outer edge of the substrate. In this configuration the OLEDs 410 may be disposed directly on the sides 405 of the substrate, or an intervening mode expanding layer 550 may be disposed between the substrate edge 405 and the OLEDs 410. In the example shown in FIGS. 5A-5B the OLEDs 410 are disposed perpendicular or approximately perpendicular to the surfaces 401, 402 of the substrate. They also may be placed on a beveled surface 405 such as illustrated in FIG. 4B.

The light emitting surface 402 may be roughened to increase the portion of light that is outcoupled through the surface 402. In some cases, a gradient may be applied to the surface, to increase outcoupling at different points of the surface 402. For example, a linear gradient may be used in which the surface is more or less roughened closer to the center than at the edges. The type and degree of roughening may be selected to achieve a desired emission profile for the device.

One or more edge surfaces 405 of the device may be beveled as previously described. As will be readily understood by one of skill in the art, the angle of the surface 405 relative to the OLEDs 410 and the substrate material may determine the relative amount of light emitted through the surface 405 relative to the other surfaces 401, 402. For example, a bevel angle may be used that achieves substantially total internal reflection of light emitted by the adjacent OLED, or that directs the majority of light into the center of the substrate or the device. Thus, different bevel angles can be used to achieve a device having a higher or lower brightness relative to the main light emitting surface 402. For example, the light emitted through the beveled edges 405 may be less than, equal to, about equal to (e.g., within 10%), or more than 100% the brightness of light emitted through the top surface 402. When the device is used as a component of a general illumination fixture, this allows for fixtures with visible borders, edges, or other features of differing brightness. For example, when a single panel is used, the fixture may be constructed to have visibly brighter or dimmer edges, or to have no visible difference between the periphery and the central portion. Such differences can be useful for aesthetic or functional purposes, such as where particular lighting conditions are desired. Similarly, if multiple panels as shown in FIGS. 4-5 are used, a device may be constructed that has a visible grid or other arrangement in the visibly emissive portion of the fixture. In other configurations, a fixture may provide substantially uniform lighting, such that there is no visible difference between the light emitted at the periphery of the device and at the center, while still using OLEDs that are relatively small compared to the substrate.

In other configurations, one or more OLEDs can be integrated onto a bevel on the substrate surface 401 such that the OLED tilts inward toward the center of the substrate, at such an angle that the fraction of light that is directly outcoupled from the angled outer surface is equal to the light outcoupled from the opposite surface 402. In this configuration, a metal coating may not be required, thus avoiding the additional cost and accompanying loss of the metal coating.

In some configurations, one or more edges 405 may be coated with a reflective material, such as a metal. This may prevent or reduce light emission through the surfaces 405, thus causing light to be emitted instead through one or more of the other surfaces 401, 402.

The substrate 400 and/or the mode expanding regions 550 may function as a light distributor, thus allowing for use of smaller OLEDs than would otherwise be feasible. For example, the substrate 400 may include low-cost, simple materials such as Lucite. The brightness desired for the entire fixture may be less than the brightness the OLED is capable of producing, thus allowing the area of the OLED to be reduced proportionally to its brightness. For example, if the operating brightness is ten times the brightness desired for the fixture, the fixture area may be ten times the OLED emission area, or a linear dimension equal to $1/\sqrt{10}$ of the fixture. More generally, if the emissive surface 402 of the device has a surface area A and the device is configured to emit light at a total brightness B, then using an OLED with an operating brightness of W that is greater than B, the surface area of the OLED may be reduced to (B/W)A or less. It may be preferred for B/W to be not more than about 0.2, preferably not more than about 0.1.

As previously described, one or more OLEDs 410 may be disposed perpendicular or substantially perpendicular to the emitting surface(s) 402, 401. Multiple OLEDs may be used, such as shown in FIG. 5B, where each OLED 410 is positioned on a separate edge surface of the substrate 400. One or more mode expanding regions 550 may be placed between each OLED and the edge surface of the substrate. The mode expanding region(s) preferably are constructed from material and with a geometry that will produce a high degree of internal reflection, so as to outcouple light from the region into the substrate. For example, it generally is preferred for the height and length of a mode expanding region to be within about 10-20% of each other, or more preferably about the same. A mode expanding region also may include additional features to prevent light from being emitted in directions other than into the substrate. For example, the outer edges 511 between the OLED and the substrate may be coated with a metal layer, or may be positioned at an angle to achieve substantially total internal reflection. Suitable materials for use in a mode expanding region include dielectrics known in the art, including transparent plastic and transparent glass materials. In some configurations the mode expanding region may be fabricated from any material that is substantially transparent at the wavelengths emitted by the adjacent OLED, such as where reflective surfaces 511 are used. Where reflective outer surfaces are used, the surfaces 511 may be said to define the mode expanding region, since the specific material used is less important so long as it does not absorb a significant portion of the light emitted by the adjacent OLED.

The "length" of a mode expanding region is the distance from an OLED to the part of the device that emits light towards a viewer, for example, the distance from 410 to 402 in FIG. 5B. The "height" of a mode expanding region is the dimension perpendicular to the light emitting surface of the fixture where the mode expanding region meets the light emitting surface, for example, the dimension of 550 that is perpendicular to the plane of 402 where 550 meets 402 in FIG. 5B.

The configurations and features described with respect to FIGS. 5A-5B may be combined with those described with respect to FIGS. 4A-4B. For example, OLEDs may be positioned both on the substrate surface 401 and on or adjacent to the substrate edge surfaces 405, and the edge surfaces 405 may or may nor be beveled.

The fact that organic devices can be directly and easily integrated into these systems also may be advantageous relative to inorganic LEDs that require expensive or complex fixtures. The devices described herein may include other features. For example, the substrate 400 and/or other features described may be flexible, allowing for other than planar shapes of the complete devices. The devices also may be operated using less power at a given brightness than other fixtures, such as incandescent sources, allowing for efficiency gains in general illumination and other applications. The devices may be used in a variety of applications and devices, such as for backlighting applications in full color or other displays. In some configurations, white OLEDs (WOLEDs) may be used for the OLEDs described with respect to FIGS. 3-5. Each OLED described, such as the OLEDs 410 in FIGS. 4-5, may include multiple light emitting devices, or each may be a single and/or separate device. The OLEDs may be fabricated using any of the techniques known in the art, as previously described.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device comprising:
   a transparent substrate comprising a first surface and a second surface; and
   an organic light emitting device disposed only on a peripheral region of the transparent substrate and configured to emit light into the transparent substrate.

2. The device of claim 1, wherein the organic light emitting device is disposed on, and about parallel to, the first surface.

3. The device of claim 1, wherein the second surface is roughened.

4. The device of claim 3, wherein the roughened surface has a linear gradient having a higher degree of roughening at the center of the surface than at peripheral regions of the surface.

5. The device of claim 1, wherein at least one edge of the substrate is beveled.

6. The device of claim 5, wherein the beveled edge is coated with a metal.

7. The device of claim 5, wherein light emitted through the beveled edge has a brightness not more than 100% of light emitted from the second surface.

8. The device of claim 5, wherein light emitted through the beveled edge has a brightness of at least 100% of light emitted from the second surface.

9. The device of claim 5, wherein light emitted through the beveled edge has a brightness that is within 10% of the brightness of light emitted from the second surface.

10. The device of claim 1, wherein the angle of the beveled edge is sufficient to achieve substantially total internal reflection of light emitted by the organic light emitting device at the interior surface of the edge.

11. The device of claim 1, wherein the organic light emitting device is disposed at an angle that directs a majority of light emitted by the organic light emitting device from the organic light emitting device toward the center of the device.

12. The device of claim 1, wherein the device is flexible.

13. The device of claim 1, wherein the second surface has a surface area A, the device emits light at a total brightness B, the organic light emitting device has an operating brightness W>B, and the organic light emitting device has a surface area of not more than about (B/W)A.

14. The device of claim 1, wherein the organic light emitting device is substantially perpendicular to the second surface.

15. The device of claim 14, further comprising:
a second organic light emitting device disposed on a second edge of the device, the second edge being substantially perpendicular to the first surface and to the second surface, and separate from the first edge.

16. The device of claim 14, further comprising a mode expanding region disposed between the first edge and the substantially transparent substrate.

17. The device of claim 16, wherein the mode expanding surface is defined by a reflective surface adjacent to the first edge.

18. The device of claim 17, wherein the reflective surface is coated with a metal.

19. The device of claim 17, wherein the reflective surface is disposed at an angle to cause substantially total internal reflection of light emitted by the organic light emitting device within the mode expanding region.

20. The device of claim 14, wherein the roughened surface has a linear gradient having a higher degree of roughening at the center of the surface than at the peripheral regions of the surface.

21. The device of claim 14, wherein the device is flexible.

22. A light-emitting device constructed to emit light at a brightness B, the device comprising:
a substantially transparent substrate comprising a first surface with surface area A and a roughened second surface; and
an organic light emitting device disposed on the first side of the transparent substrate, the organic light emitting device having an operating brightness W>B and a surface area of not more than about (B/W)A,
wherein B/W is not more than about 0.2.

23. The device of claim 22, wherein B/W is not more than about 0.1.

* * * * *